(12) United States Patent
Sorensen (10) Patent No.: US 7,397,233 B2
(45) Date of Patent: Jul. 8, 2008

(54) VOLTAGE MEASURING DEVICE

(75) Inventor: Thomas Sorensen, Darien, Annacotty, Limerick (IE)

(73) Assignees: Suparules Limited, Limerick (IE); Thomas Sorensen, Annacotty, County Limerick (IE)

( * ) Notice: Subject to any disclaimer, the term of this patent is extended or adjusted under 35 U.S.C. 154(b) by 0 days.

(21) Appl. No.: 10/585,561

(22) PCT Filed: Jan. 7, 2005

(86) PCT No.: PCT/EP2005/000187

§ 371 (c)(1), (2), (4) Date: Oct. 11, 2006

(87) PCT Pub. No.: WO2005/069020

PCT Pub. Date: Jul. 28, 2005

(65) Prior Publication Data

US 2007/0086130 A1  Apr. 19, 2007

(51) Int. Cl.
*G01R 19/00* (2006.01)
*G01R 31/02* (2006.01)
*G01R 5/14* (2006.01)
*G01R 27/26* (2006.01)

(52) U.S. Cl. .................. 324/76.11; 324/72; 324/129; 324/686

(58) Field of Classification Search ............ 324/72, 324/72.5, 76.11, 126, 129, 658, 686, 690
See application file for complete search history.

(56) References Cited

U.S. PATENT DOCUMENTS

| 4,041,373 | A | * | 8/1977 | Maringer | 324/72.5 |
| 4,052,665 | A | * | 10/1977 | Gruenwald | 324/72.5 |
| 4,090,130 | A | * | 5/1978 | Willenbecher, Jr. | 324/126 |
| 5,473,244 | A | * | 12/1995 | Libove et al. | 324/126 |

* cited by examiner

*Primary Examiner*—Anjan Deb
*Assistant Examiner*—Timothy J Dole
(74) *Attorney, Agent, or Firm*—Whiteford, Taylor & Preston LLP; Jeffrey C. Maynard (57) ABSTRACT

A device for measuring alternating voltage in a conductor under test using a first set of capacitive voltage sensors 32$a$-$f$ mounted on an electrically insulating support member. The sensors are disposed on the support member at spaced intervals along a first notional circle and are connected in parallel between an inner signal conductor 33 and a zero voltage reference conductor 37. A second set of capacitive voltage sensors 34$a$-$f$ are mounted on the support member at spaced intervals along a second notional circle and are connected in parallel between an outer signal conductor 35 and the reference conductor 37. The support member is configured to allow a conductor under test 38 to be introduced into the interior of the device so that the sensors surround the axis of the conductor. Each sensor has a signal electrode 48 connected to the signal conductor and a reference electrode 50 connected to the reference conductor and is orientated with the signal electrode facing the conductor under test. The voltage in the conductor under test is derived as a function of the voltage across the signal conductor and the reference conductor.

11 Claims, 12 Drawing Sheets

(PRIOR ART)

FIGURE 1

(PRIOR ART)

VOLTAGE MEASURING DEVICE

FIELD OF THE INVENTION

This invention relates to a device for measuring alternating voltage in a conductor under test, for example, an overhead AC power line.

BACKGROUND OF THE INVENTION

The measurement of power factor and power quality is an important aspect in the monitoring of electrical utilities. In order to calculate the power factor and quality of a particular AC power line, the alternating voltage and current of the line must be measured. For overhead power lines, removable contactless voltage measuring devices provide the best balance of ease of use and flexibility.

Figure 1:
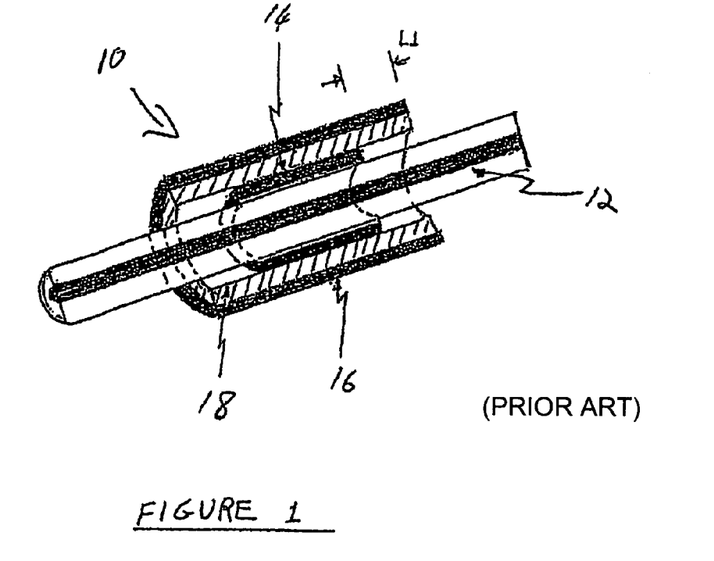
FIGS. 1 and 2 are views of prior art voltage measuring devices previously described.

FIG. 1 illustrates a non-contact voltage measuring device 10 as disclosed in JP2002131341. The figure shows a longitudinal section of an insulated conducting wire 12, to which an alternating voltage is applied with respect to ground. This is the voltage waveform to be observed by the device 10. The device 10 consists of two conducting pipes—an inner conductor 14 and an outer conductor 16—that surround the wire 12. The two conducting layers of the device are usually separated by a dielectric layer 18. The output voltage of the device 10 may be picked up by a shielded cable (not shown) whose shield is connected to the outer conductor 16 and whose centre is attached to the inner conductor 14 through a small hole (not shown) in the outer conductor 16 and dielectric 18.

The arrangement shown in FIG. 1 is excellent for preventing interference pickup from stray electric fields created by other voltage sources external to the outer conductor of the device if the following two conditions are met:

1) The outer conductor 16 of the device 10 completely encloses the inner conductor 14 around its circumference.

2) The length of longitudinal overshoot L1 of the outer conductor 16 past the inner conductor 14 is greater than the diameter of the outer conductor 16.

Condition 2 makes sure that any ingress of interfering electric fields from the two ends of the device 10 is minimized.

When these two conditions are met, the outer conductor 16 of the device 10 effectively shields the inner conductor 14 from external electric fields and it responds only to electric fields due to the charge on the conductor 12.

However, it is apparent that the device shown in FIG. 1 can only be used in applications where the wire 12 can be threaded through the device or if the device has more than one moveable part that can be clipped or attached together.

Another restriction on the use of this type of device occurs if the wire diameter is large, as the length of the device becomes large in order to meet condition (2). For a wire of 3.5 cm diameter, condition (2) would result in a device typically 9 cm long.

Because of these restrictions, this low interference structure is virtually unused on high voltage overhead power lines.

Figure 2:
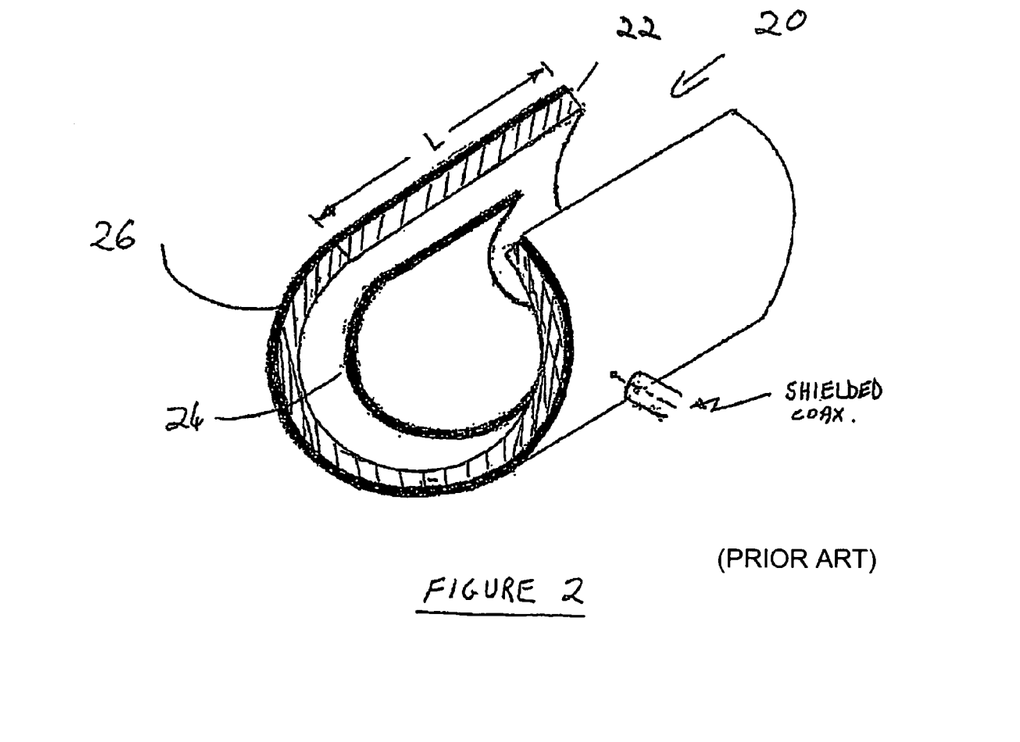

The most common type of voltage measuring device for overhead power lines is shown in FIG. 2. Here a gap 20 is made in the dielectric 22 and the inner and outer conductors 24, 26 respectively. This allows the device to be easily attached to the existing power line. In practice, the length L of the device is also made much smaller than would be required to meet condition (2) above. Thus, the device shown in FIG. 2 suffers from interference from external fields entering through the gap 20 and the two ends of the device. The result is that the device is not usable in many applications for accurate power factor and quality measurements, particularly if an interfering phase is situated in the direction of the gap 20 in the device.

It is an object of the invention to provide an improved alternating voltage measuring device in which these disadvantages are avoided or mitigated.

SUMMARY OF THE INVENTION

Accordingly, the present invention provides a device for measuring alternating voltage in a conductor under test, the device comprising first and second sets of capacitive voltage sensors mounted on an electrically insulating support member, the first set of sensors being positioned along a first notional closed path and being connected in parallel between a first signal conductor and a reference conductor, the second set of sensors being positioned along a second notional closed path surrounding the first closed path and being connected in parallel between a second signal conductor and the same reference conductor as the first set, the support member being configured to allow a conductor under test to be introduced into the interior of the device so that the sensors surround the axis of the conductor under test, and each sensor having a signal electrode connected to the respective signal conductor and a reference electrode connected to the reference conductor, the sensors of the first set being orientated with the signal electrode facing the conductor under test, and the sensors of the second set being orientated with the signal electrode facing away from the conductor under test, and the device further including means for deriving the voltage in the conductor under test as a function of the voltage across the first signal conductor and the reference conductor and the voltage across the second signal conductor and the reference conductor.

BRIEF DESCRIPTION OF THE DRAWINGS

An embodiment of the invention will now be described, by way of example, with reference to the accompanying drawings, in which.

DETAILED DESCRIPTION OF SPECIFIC EMBODIMENTS

Figure 3A:
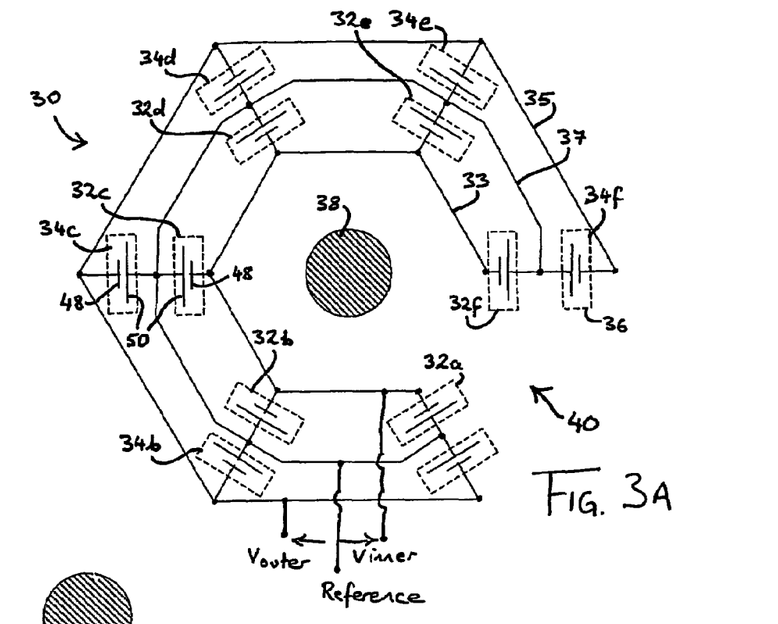
FIG. 3A is a schematic view of a voltage measuring device according to an embodiment of the present invention.

Referring to FIG. 3A, the voltage measuring device 30 comprises an electrically insulating motherboard (not shown in FIG. 3A but to be described with reference to FIGS. 5 to 7) upon which are mounted a plurality of capacitive voltage sensors 36. These sensors 36 comprise an inner set of sensors 32a-f and an outer set of sensors 34a-f. The inner and outer sets of sensors 32a-f and 34a-f are mounted in a substantially common plane and are substantially identical in construction. The inner set of sensors 32a-f are disposed at substantially equal intervals along a first notional circle 32 while the outer set of sensors 34a-f are disposed at substantially equal intervals along a second notional circle 34 concentric with the first circle 32. The sensors 36 are radially aligned in pairs relative to the common centre of the circles 32 and 34, i.e. 32a/34a, 32b/34b, etc.

Each sensor 36 is in the form of a parallel plate capacitor and has a signal electrode 48 and at least one reference electrode 50 substantially parallel thereto. The sensors 32a-32f of the inner set are connected in parallel between a sense conductor 33 and a reference conductor 37, and the sensors 34a-34f of the outer set are connected in parallel between a sense conductor 35 and the same reference conductor 37. As will be described, the conductors 33, 35 and 37 are formed as conductive tracks on the motherboard.

The motherboard has a gap 40 which allows for the positioning of the measuring device 30 so that a conductor or wire 38 whose voltage is to be measured (referred to herein as a "conductor under test") can be introduced into the interior of the notional circles 32, 34 with the axis of the conductor under test 38 normal to the plane containing the sensors (i.e. normal to the plane of FIG. 3A) and coincident with the centre of the circles 32 and 34, so that the sensors 36 lying along each circle 32, 34 surround the axis of the conductor 38 with the electrode surfaces 48, 50 normal to the axis of the conductor 38.

The sensors 32a-f on the inner circle 32 are all orientated so that their signal electrodes 48 face the conductor under test 38 whose voltage waveform is to be monitored. These sensors 32a-f provide an input voltage $V_{inner}$ with respect to the voltage on the reference conductor 37. The sensors 34a-f on the outer circle 34 are paired with corresponding sensors 32a-f of the inner circle, but are positioned so that the signal electrode 37 of each sensor 36 faces away from the conductor under test 38. The purpose of the outer set of sensors 34a-f is to reduce interference from external sources. These sensors 34a-f provide an input voltage $V_{outer}$ with respect to the reference voltage. In each sensor 36, the reference electrode 50 has a substantially larger area than the signal electrode 48, so as to shield the latter from electric fields from sources on the side of the sensor opposite the signal electrode.

It is seen that when the conductor under test 38 which is the source of an electric field is in the measurement position within the measuring device 30, all the sensors 32a-f in the inner ring 32 are aligned with their unshielded signal electrodes 48 facing the source 38, resulting in a large $V_{inner}$. All the sensors 34a-f in the outer ring 34 are aligned with their shielded reference electrodes 50 facing the source 38. This results in a small $V_{outer}$. The voltage induced in the inner ring 32 $V_{inner}$ due to the source 38 is therefore larger than the voltage pickup $V_{outer}$ of the outer ring 34. When these voltages are subtracted, a relatively large output voltage is obtained, which is largely free of outside interference.

Figure 3B:
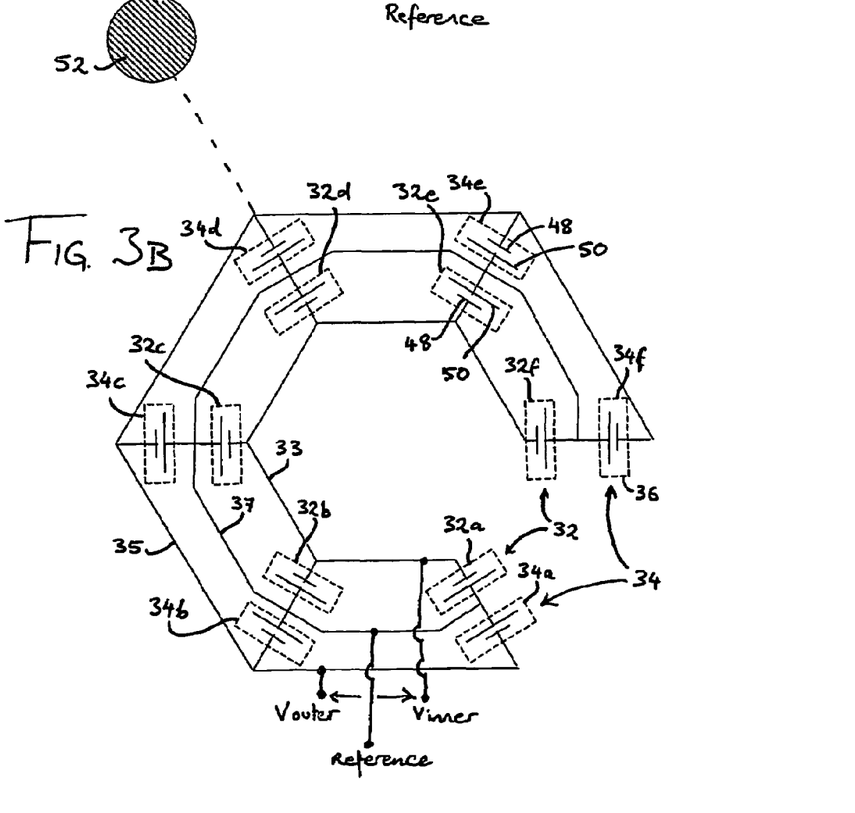
FIG. 3B is a schematic view of the voltage measuring device of FIG. 3A when positioned adjacent to an interfering power line.

FIG. 3B illustrates an interfering source 52 located outside the voltage measuring device 30. Two outer sensors, 34a and 34d, are directly in line with the interfering source 52. However, they are aligned oppositely to the source 52 since the source 52 is on the unshielded (or signal electrode 48) side of sensor 34d and on the shielded (or reference electrode 50) side of sensor 34a. The corresponding two inner sensors, 32a and 32d, are also aligned oppositely for the interfering source 52 with the shielded side 50 of sensor 32d facing the source 52 and the unshielded side 48 of sensor 32a facing the source 52. A similar type analysis applies to the other sensors of the measuring device.

Thus, if the interfering source 52 is far away, it is found that $V_{inner}$ and $V_{outer}$ are equal for this interfering source 52, and the pickup from external sources may be reduced or eliminated by subtracting $V_{outer}$ from $V_{inner}$. The more pairs of inner and outer sensors 36 used, the better the cancellation effect achieved.

Figure 4:
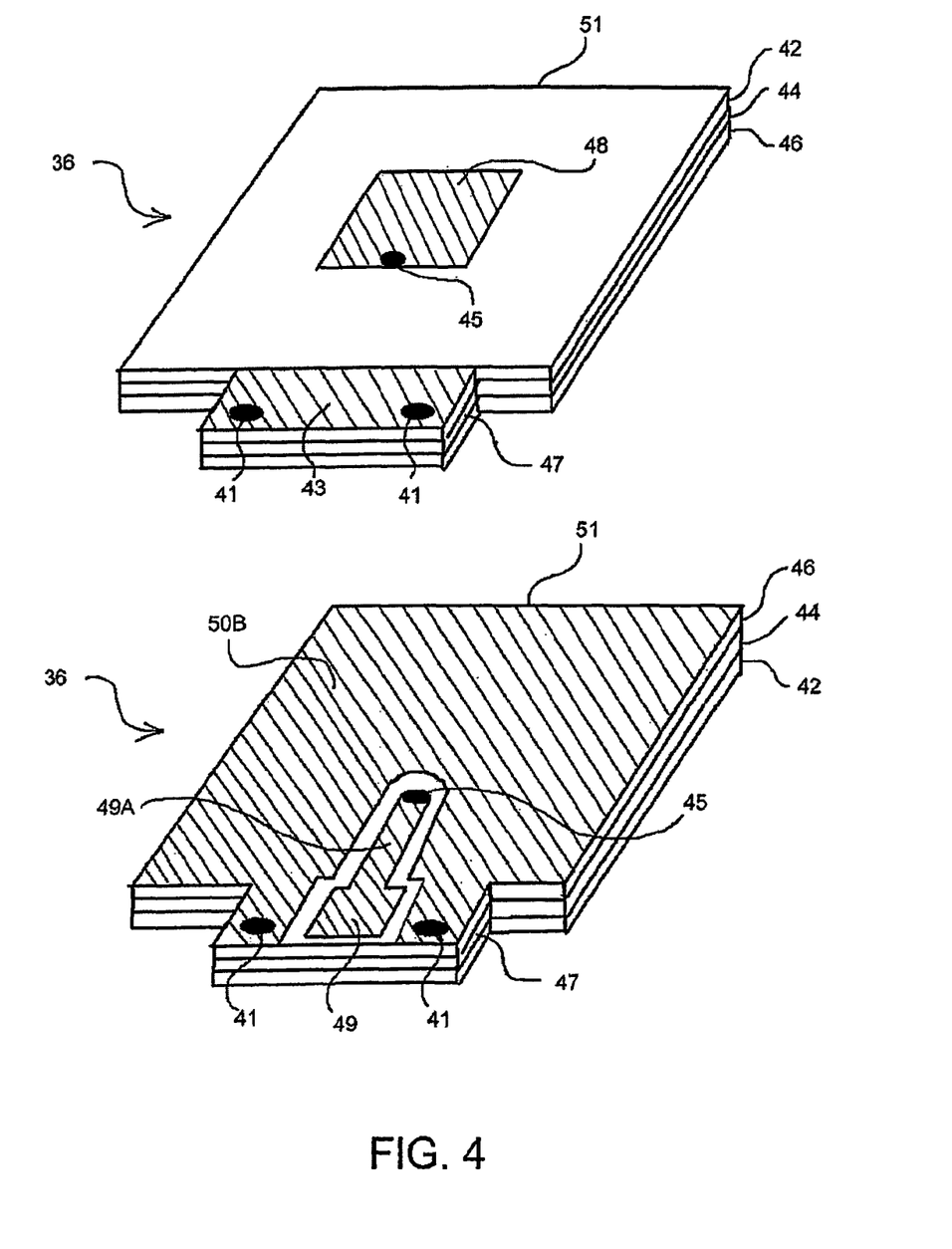
FIG. 4 shows perspective top and bottom views of one of the individual capacitive sensors used in a practical implementation of the device of FIG. 3A.
Figure 4A:
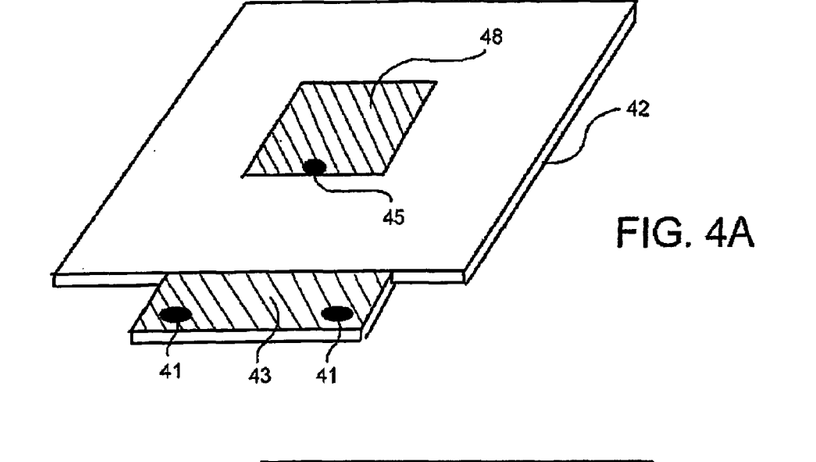
FIGS. 4A to 4C are, respectively, perspective views of the top, middle and bottom layers of the sensor of FIG. 4.
Figure 4B:
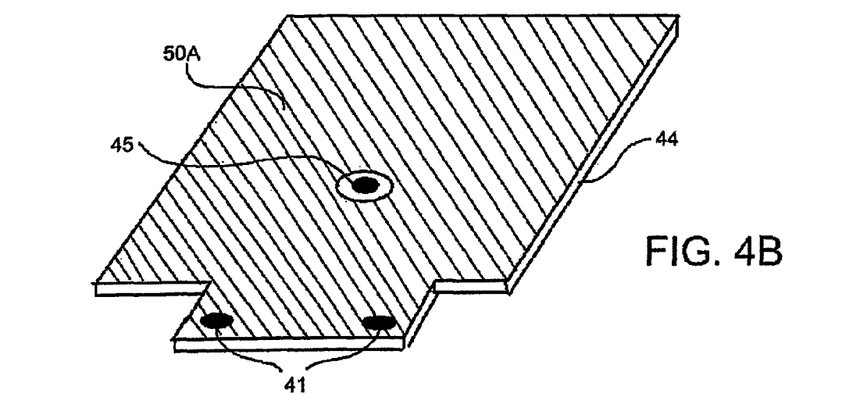
Figure 4C:
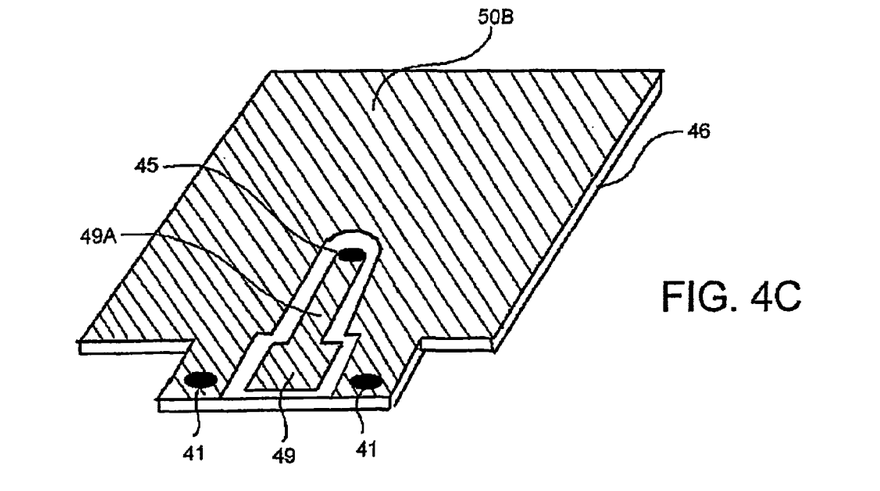

FIGS. 4 and 4A to 4C show the construction of each sensor 36 used in the present embodiment. The top view of the sensor 36 is shown in the upper part of FIG. 4, while the bottom view of the sensor is shown in the lower part of FIG. 4 (expressions of orientation used herein such as "top" and "bottom refer to the orientation shown in the drawings and do not restrain the orientation of the device in use). The sensor 36 comprises a laminate of the three substantially flat printed circuit board (PCB) layers shown individually in FIGS. 4A to 4C—a top layer 42, a middle layer 44 and a bottom layer 46. Each PCB layer 42-46 comprises an electrically insulating substrate with various conductive areas and/or tracks deposited on one surface of each, as seen in FIGS. 4A-C. The layers 42-46 are bonded together to form the laminate structure shown in FIG. 4, it being appreciated that the PCB layer 46 shown in FIG. 4C is turned over prior to lamination so that the top surface shown in 4C is actually exposed on the underside of the sensor, as shown in the lower part of FIG. 4. A typical sensor of this type has a surface area of approximately 4 cm squared, though the dimensions can of course be tailored to suit the particular application. The PCB construction of the sensors 36 ensures they are inexpensive, accurate, light, and compact.

To simplify manufacture, the main body 51 of the sensor 36 has a generally square shape to simplify manufacture, and has a rectangular tab 47 extending from one edge (the base) of the main body 51. The signal electrode 48 is deposited as a square section of conductor deposited at the centre of the top layer 42. A via 45 extends from the signal electrode 48 through the top layer 42, middle layer 44 and bottom layer 46 to electrically connect the signal electrode 48 to a signal pad 49 located on the bottom surface of the tab 47 via a conductive track 49A deposited on the layer 46.

The entire surface of the middle layer 44 is covered with a deposited conductive layer 50A except for a clear area surrounding the via 45, and the entire surface of the bottom layer 46 is likewise covered with a deposited conductive layer 50B except for a clear area surrounding the via 45, the signal pad 49 and the conductive track 49A connecting the two. Vias 41 extend through the three layers 42-46 to electrically connect the layers 50A and 50B in common to a zero volt reference pad 43 located on the top surface of the tab 47.

Thus, the signal electrode 48 is connected by the vias 45 to the signal pad 49 on the bottom surface of the tab 47, while the layers 50A and 50B are connected by the vias 41 to the reference pad 43 on the top surface of the tab 47.

This sensor 36 is essentially a small capacitive probe with its capacitance existing between the signal electrode 48 on the top layer 42 and the reference electrode 50 formed by the layers 50A and 50B on the middle layer 44 and the bottom layer 46. A voltage signal is induced between the signal electrode 48 and the reference electrode 50 by the normal component of an applied electric field to the top layer 42.

For best operation of the overall measuring device 30, the area of the reference electrode layers 50A and 50B on the middle and bottom layers 44 and 46 of the sensor 36 is made larger than the area of the signal conductor 48 on the top layer 42, as seen in FIGS. 4A-C. This causes the sensor 36 to pick up a higher induced voltage from an electric field source located above the top layer 42 of the sensor 36 than it does from the same electric field source located the same distance below the bottom layer 46 of the sensor 36. When the larger reference conductor 50 is between the signal conductor 48 and the electric field source, it partially shields the signal conductor 48 from the source field. The larger the area of the reference conductor 50 in comparison with the signal conductor 48 of the sensor 36, the greater this shielding effect.

Figure 5:
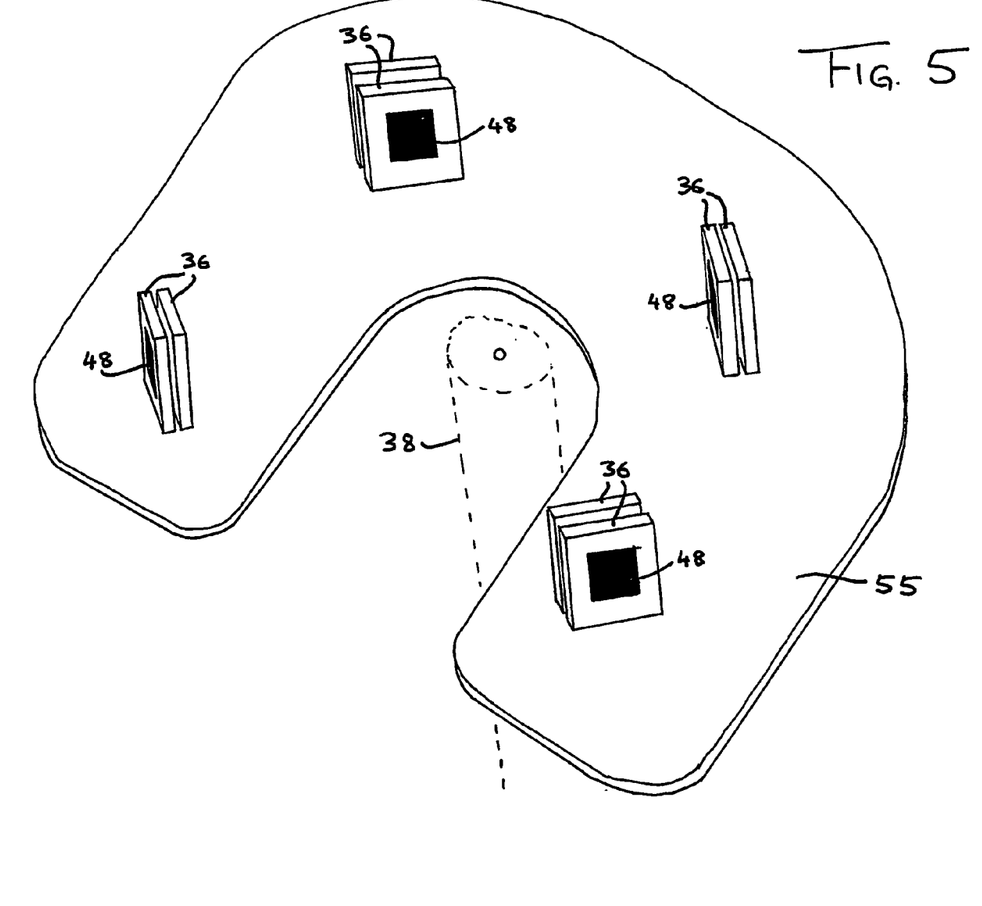
FIG. 5 is a perspective view of a set of eight capacitive sensors of FIG. 3 mounted on a motherboard.

The inner and outer printed circuit board sensors 36 are mounted vertically as shown in FIG. 5 on a printed circuit motherboard 55.

Figure 6A:
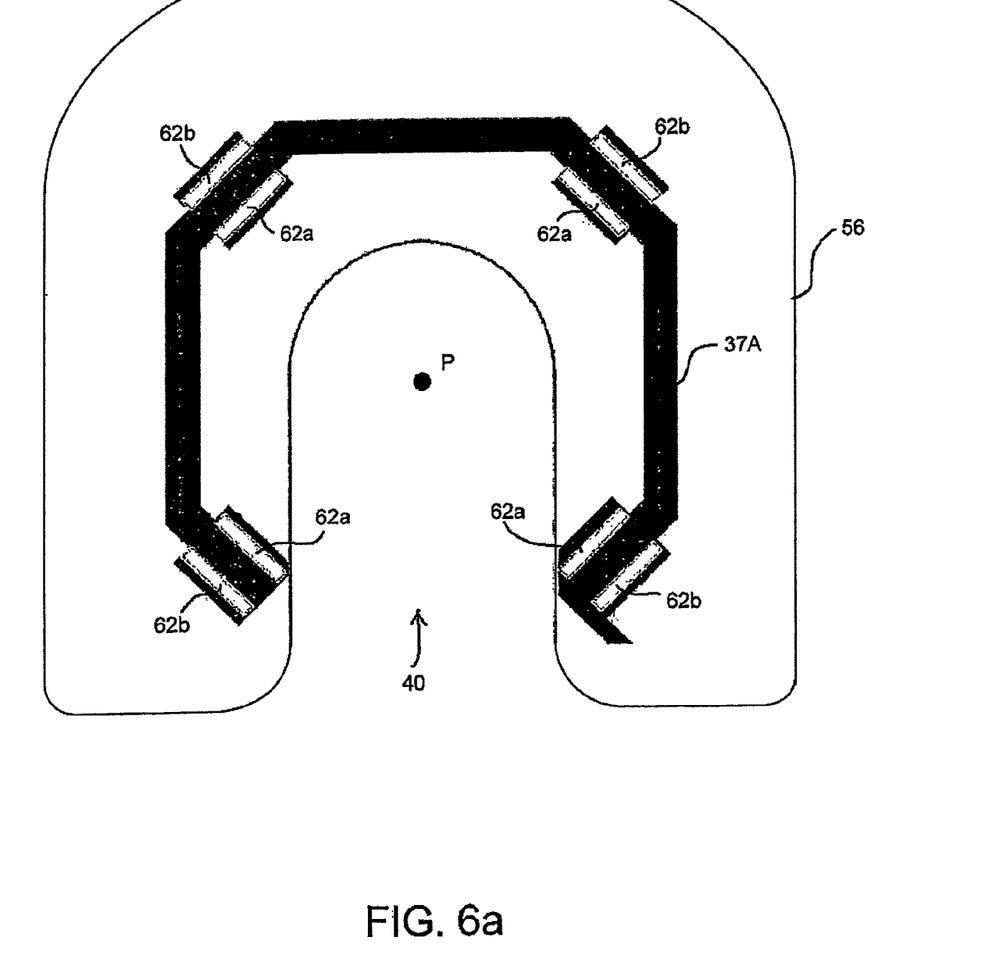
FIGS. 6A to 6C are, respectively, plan views of the top, middle and bottom layers of a multilayer motherboard upon which a plurality of individual sensors of FIG. 4 are mounted in the practical implementation of the device of FIG. 3A.
Figure 6B:
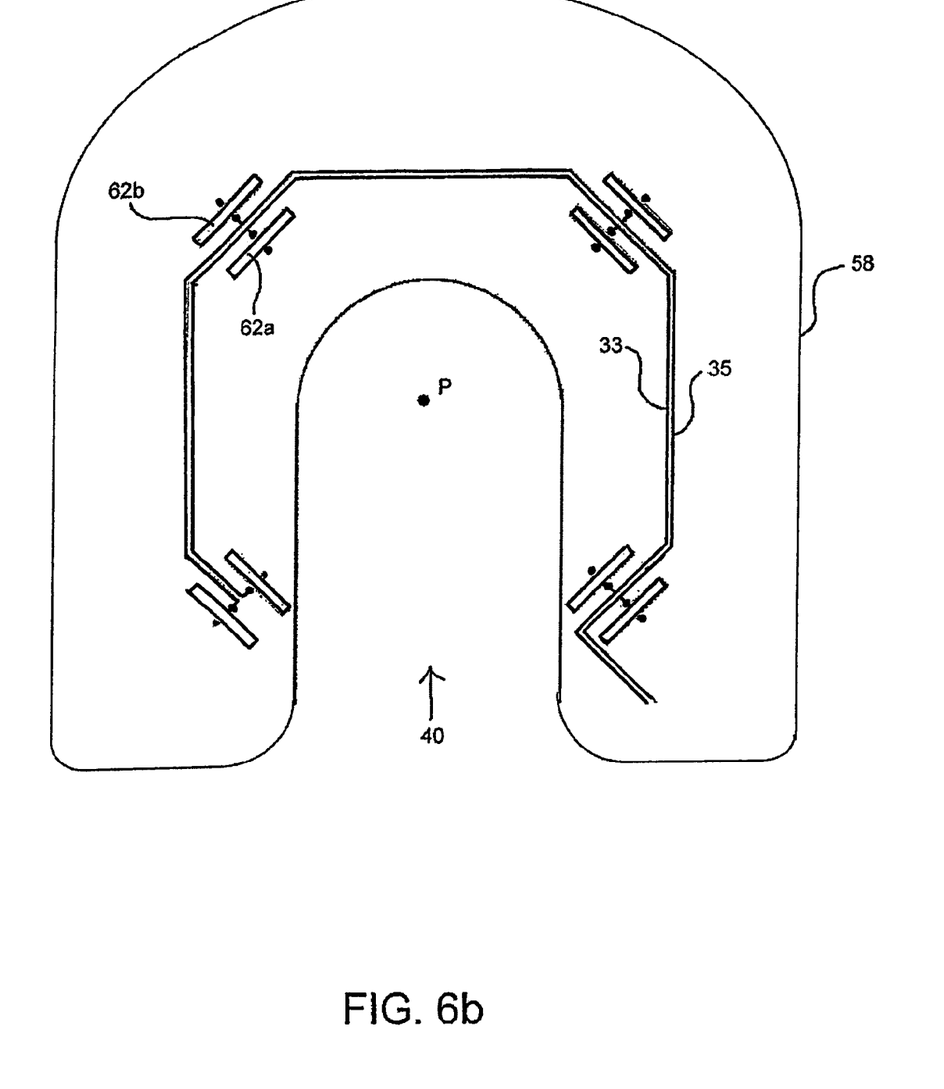
Figure 6C:
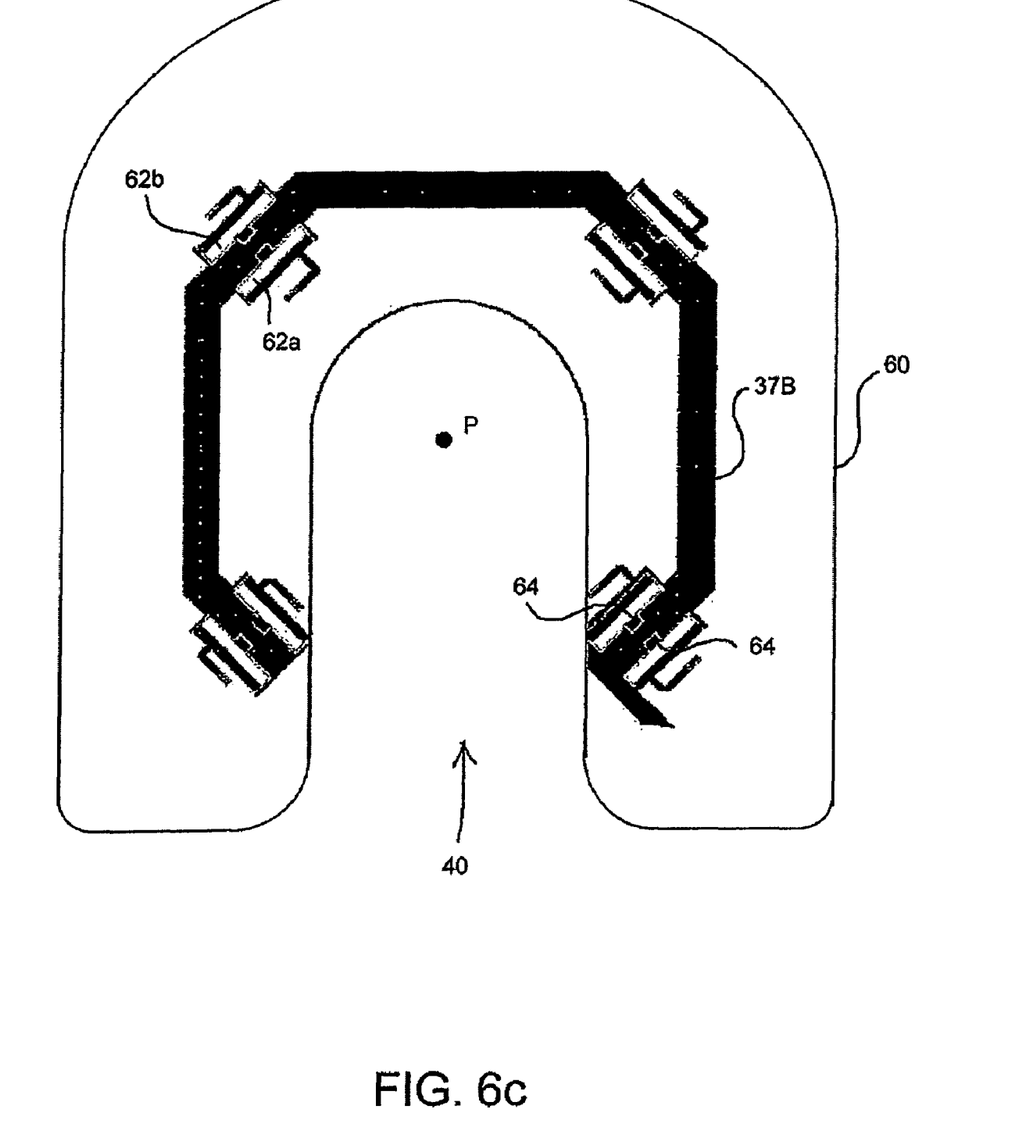

Motherboard 55 is a laminate of three individual, substantially flat, generally U-shaped PCB layers 56, 58, and 60 shown in top plan view in FIGS. 6A to 6C respectively. Each PCB layer is substantially identical in size and shape in plan view and comprises an electrically insulating substrate with an inner set of four slots 62a and an outer set of four slots 62b. The inner slots 62a are tangential to and equally spaced around a notional first circle centered at point P and the outer slots 62b are tangential to and equally spaced around a notional second circle concentric with but of greater diameter than the first circle. When the three layers 56-60 are laminated together, the slots in each of the three layers are in alignment, so that FIG. 6A can be considered to be a plan view of the laminated multi-layer motherboard as a whole, as well as the plan view of the top layer 56. The conductive tracks (to be described) shown in FIG. 6C are actually deposited on the bottom surface of the multi-layer motherboard, so FIG. 6C can be regarded as a top plan view of the layer 60 with the insulating substrate artificially shown transparent solely for the purpose of revealing the structure on its bottom surface.

Eight sensors 36 constructed as shown in FIG. 4 are mounted vertically on the motherboard as shown in FIG. 5 by inserting the tab 47 of each sensor into a respective slot 62a or 62b in the motherboard, the slots 62a and 62b being sized so that the tabs 47 are a snug fit in the slots. It will be appreciated that the construction shown in FIGS. 6A-C uses only four pairs of sensors 36 rather than the six pairs shown in the schematic diagrams of FIGS. 3 and 5. Each sensor 36 is oriented so as to be orthogonal to a radial direction from the point P, the latter being substantially coincident with the conductor under test 38 when the latter is inserted in the slot 40. In the outer circle of four sensors, the signal electrodes 48 face outwardly away from the point P, whereas in the inner circle of four sensors the signal electrodes 48 face inwardly towards the point P, corresponding to the arrangement shown in FIGS. 3 and 5.

Figure 7A:
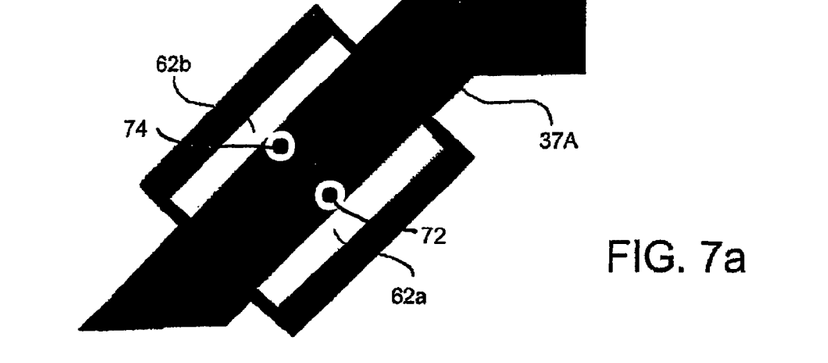
FIGS. 7A to 7C are detailed plan views of one of the mounting positions for a pair of sensors on the motherboard.
Figure 7B:
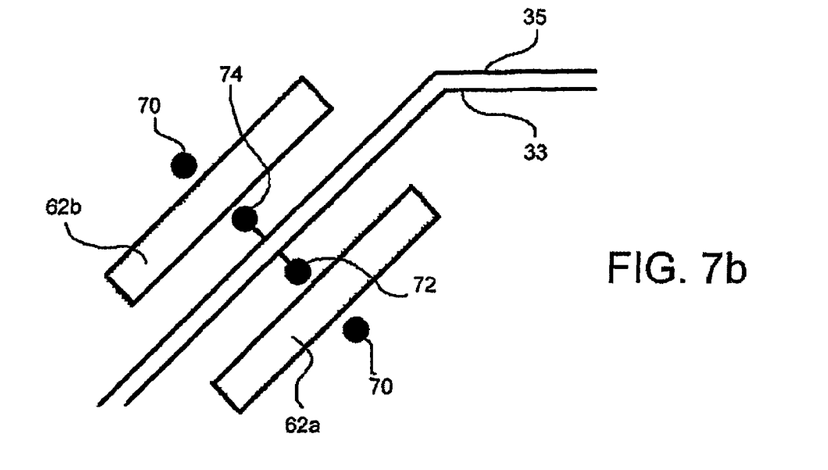
Figure 7C:
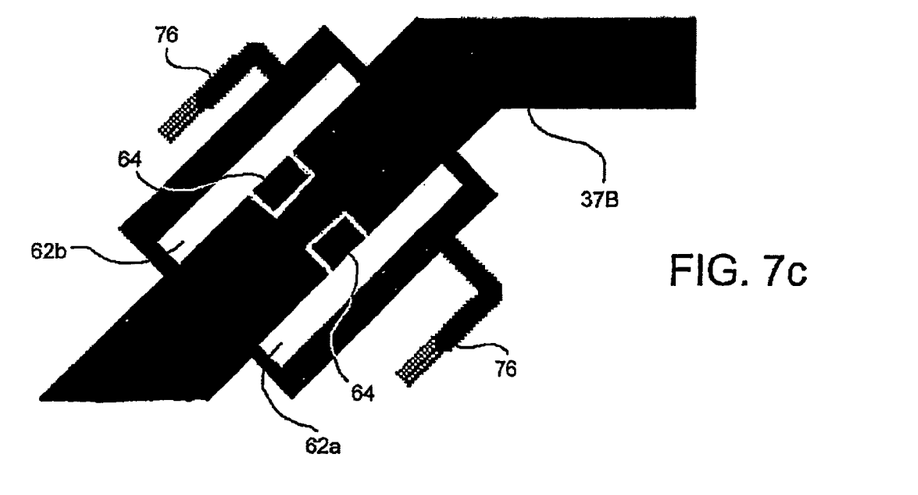

Referring also to FIGS. 7A to 7C which are more detailed enlarged views of the track layout at the top left section of the motherboard layers 56, 58 and 60 respectively, and which are equivalent to the corresponding structures at each of the other three sensor pair positions on the motherboard layers, the top layer 56 has a wide conductive reference track 37A deposited thereon which extends between and surrounds each pair of slots 62a, 62b (see especially FIG. 7A). The bottom layer 60 likewise has a wide conductive reference track 37B deposited thereon which extends between and surrounds each pair of slots 62a, 62b except for small deposited areas of conductive material 64 immediately adjacent the inner edges of the slots 62a, 62b (see especially FIG. 7C), the track 37B being spaced from the areas 64. The middle layer 58 has two narrow closely spaced conductive signal tracks 33 and 35 deposited thereon extending between the pairs of slots 62a, 62b.

In the assembled motherboard the tracks 37A and 37B are electrically connected together by vias 70 (visible only in FIGS. 6B and 7B) which pass through all three motherboard layers to electrically connect the portions of the tracks 37A and 37B on the outside edges of the slots 62a and 62b. The conductive areas 64 on the inside of the track 37B are electrically connected to the signal track 33 on the middle layer through respective vias 72 while the conductive areas 64 on the outside of the track 37B are electrically connected to the signal track 35 on the middle layer through respective vias 74. Vias 72 and 74 are also seen on the top layer in FIG. 7A but serve no functional purpose. Because the vias are drilled through the entire PCB, however, they must be isolated from the reference track 37A on the top layer.

The individual sensors 36 are mounted on the motherboard by inserting the tabs 47 of the sensors 36 into the rectangular slots 62a, 62b such that in each case the sensor signal pad 49 is immediately adjacent the conductive area 64 and, accordingly, the sensor reference pad 43 is immediately adjacent the part of the track 37B on the outside of the slot 62a or 62b. The sensors 36 are then soldered in position by soldering each signal pad 49 to the respective adjacent the conductive area 64 and each reference pad 43 to the respective adjacent part of the track 37B on the outside of the slot 62a or 62b. Thus the signal electrode 48 of each inner sensor is connected to the inner signal track 33, the signal electrode of each outer sensor is connected to the outer signal track 35, and all the reference electrodes 50A, 50B are connected in common to the reference tracks 37A and 37B. It will be evident that, except for the use of only four pairs of sensors 36, this corresponds to the electrical equivalent circuit of FIG. 3A, the reference tracks 37A, 37B collectively forming the reference conductor 37.

A particular advantage with this arrangement is that in addition to the shielding of the signal electrodes 48 by the reference electrodes 50, the narrow, closely spaced signal tracks 33, 35 are sandwiched between the much wider reference tracks 37A, 37B so that the signal tracks 33, 35 are effectively shielded from external electric fields. These tracks 33 and 35 lead to an amplifier input (not shown) for calculation of the measured voltage.

Separate shields (not shown) may be necessary on the bottom layer 60 of the motherboard 54 where the PCB sensor tabs 47 protrude through the bottom of the slots 62a, 62b as the signal pads 49 are exposed there and could pick up interference. The shields are soldered to the portions 76 of the reference track 37B on the outside edges of the slots 62a, 62b to cover the protruding areas of the sensors. The first stages of the amplifier may also need shielding by a conductive shield (not shown) which is electrically tied to the reference conductors.

Figure 8:
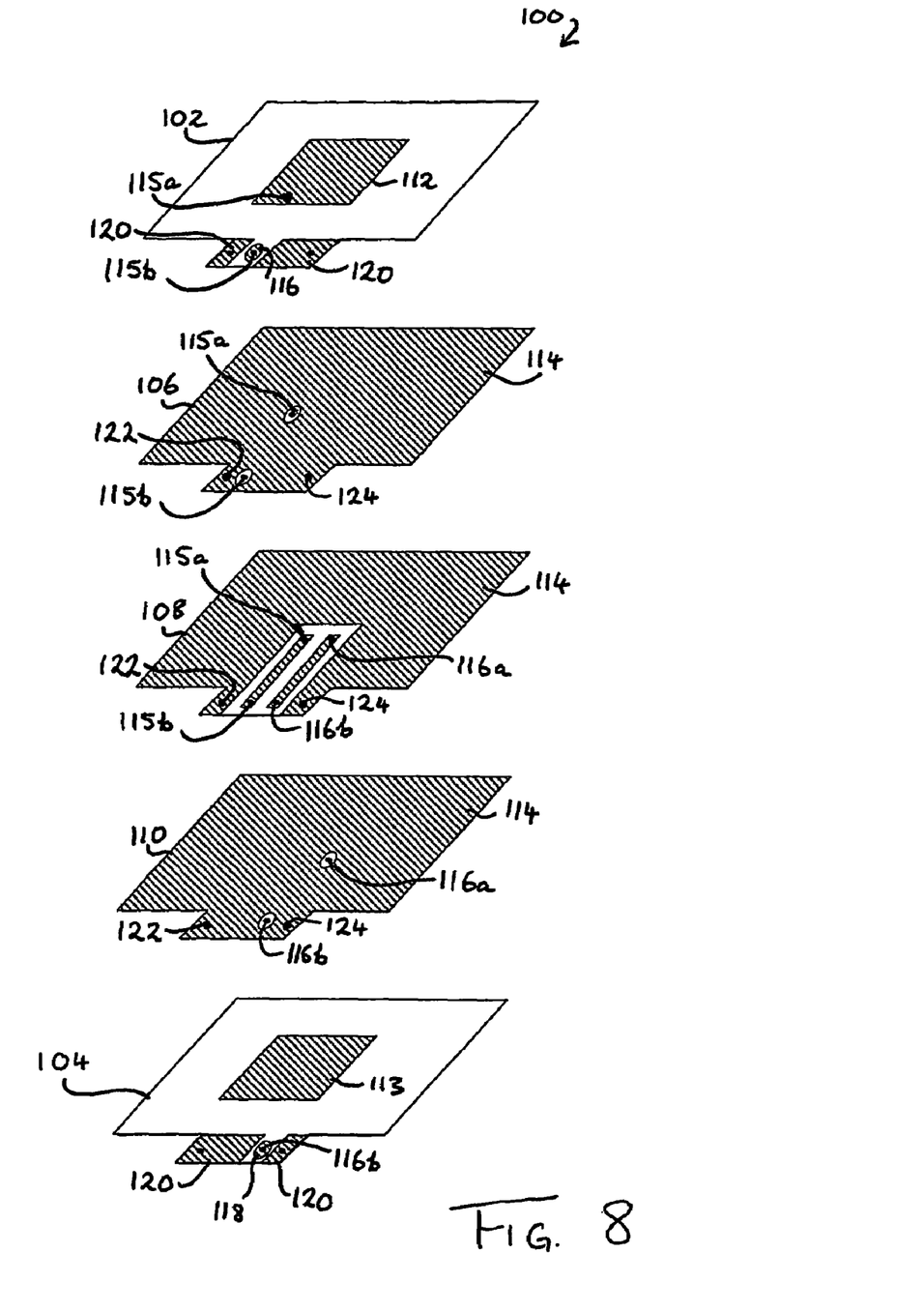
FIG. 8 is an exploded view of a five-layer printed circuit board capacitive voltage sensor according to another embodiment of the invention.

In some instances, it may be advantageous to combine each pair of inner and outer PCB sensors into one five-layer PCB sensor, and an arrangement, which performs that function, is shown in FIG. 8.

The five-layer sensor 100 performs the same function as separate inner and outer three-layer sensors 36. The sensor has a top layer 102 and a bottom layer 104, which correspond to the top layer 42 of the three-layer sensor 36. Both the top layer 102 and the bottom layer 104 comprise signal conductor sections—112 & 113—that are generally of a lesser size than that of the sensor 100 itself. The top signal conductor section 112 and the bottom signal conductor section 113 each correspond to the signal conductor section 48 present in the three-layer embodiment of the sensor 36.

The five-layer sensor 100 also has a second layer 106, a middle layer 108, and a fourth layer 110, which largely comprise a conductor portion that acts as a reference conductor 114. This reference conductor 114 corresponds to the reference conductor 50 that is present in the three-layer implementation of the sensor 36.

Each of the reference conductors 114 of the second layer 106, a middle layer 108, and a fourth layer 110 is connected to a reference solder pad 120. There are two such reference solder pads 120 present on the top layer 102 and two further pads 120 on the bottom layer 104. A pair of vias 122, 124 extend through each of the five layers to ensure that the reference solder pads 120 and the reference conductors 114 are each at reference voltage.

The signal conductor component 112 of the top layer 102 is connected by a via 115a from the top layer 102 to the middle layer 108. This is in turn connected to a via 115b from the middle layer 108 to the top layer 102, where it is connected to a solder pad 116 for that signal. The same signal routing is replicated from the signal component 113 on the bottom layer 104 to the middle layer 108 and back to the bottom layer 104, with the corresponding vias 116a & 116b, and signal solder pad 118 on the bottom layer 104 of the sensor 100.

Each of the signal vias and solder pads are insulated from the surrounding conductors, as before.

Some modifications to the motherboard will also be required in that instance.

Figure 9:
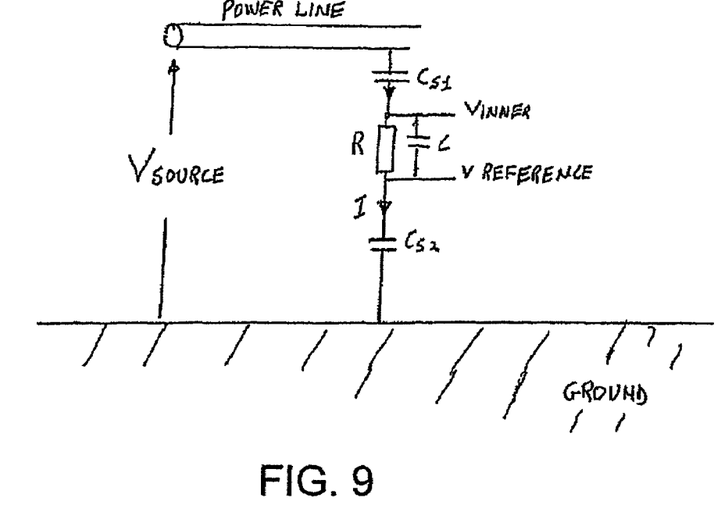
FIG. 9 is a schematic view of an electrical equivalent circuit of the physical process that induces a voltage $V_{inner}$ between the inner set of sensors and the reference voltage.

An electrical equivalent circuit of the physical process that induces a voltage $V_{inner}$ between the inner set of probes and the reference voltage is shown in FIG. 9. It is assumed that a resistor R and a capacitor C are connected between $V_{inner}$ and $V_{reference}$. $C_{S1}$ represents the stray capacitance between the power line and the inner set of probes and $C_{S2}$ represents the stray capacitance between all conductors connected to $V_{reference}$ and the ground. The current I flowing through the measuring device is given by $$I = \frac{V_{Source}}{\frac{1}{j\omega C_{s1}} + \frac{1}{j\omega C_{s2}} + \frac{R}{1+j\omega CR}}$$

Now, whereas the maximum expected stray capacitances $C_{s1}$ and $C_{S2}$ would be 10 pf and if C is chosen greater than 10 nf, then the impedance of the RC combination is far less than the impedances of the stray capacitances and to a good approximation $$I = \frac{jV_{source}}{\frac{1}{\omega C_{s1}} + \frac{1}{\omega C_{s2}}}$$

and the voltage $$(V_{inner} - V_{reference}) = I\frac{R}{1+j\omega CR} = \frac{j\omega V_{source}R}{\left(\frac{1}{C_{s1}} + \frac{1}{C_{s2}}\right)(1+j\omega CR)}$$

If at the frequencies of interest ω, the product CR is chosen large enough so that ωCR >>1 then $$(V_{inner} - V_{reference}) = \frac{j\omega V_{source}}{\left(\frac{1}{C_{s1}} + \frac{1}{C_{s2}}\right)(j\omega C)} = \frac{V_{source}}{\left(\frac{1}{C_{s1}} + \frac{1}{C_{s2}}\right)C}$$

and the voltage $V_{inner}-V_{reference}$ is an attenuated version of $V_{source}$ with no distortion or phase shift. The attenuation factor is given by $$\frac{C_{s1}C_{s2}}{C(C_{s1}+C_{s2})}$$

and depends on the stray capacitance.

To accurately predict the amplitude of $V_{source}$ from $V_{inner}-V_{reference}$ is only possible if the stray capacitances $C_{S1}$ and $C_{S2}$ are known or can be evaluated. However, for power factor and power quality measurement the absolute value of the voltage is not necessarily required. The important factors are knowing the phase of the voltage and the relative amplitude of the harmonics as well of course as also measuring current parameters. It is seen from equation (1) that $V_{inner}-V_{reference}$ is a direct replica of the voltage of the phase being monitored.

Figure 10:
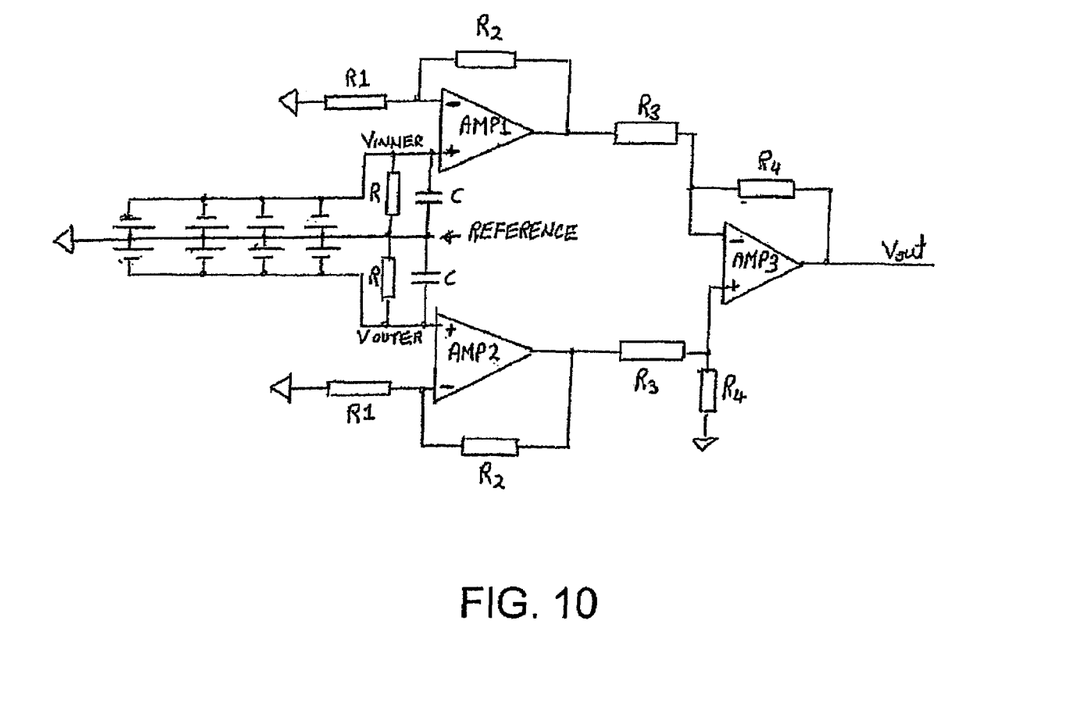
FIG. 10 is a schematic view of an electrical equivalent circuit of a complete voltage measuring device with amplifier stages according to the embodiment of the present invention.

An electrical equivalent circuit of a complete voltage measuring device with amplifier stages is shown in FIG. 10.

The two voltages $V_{inner}-V_{reference}$ and $V_{outer-Vreference}$ are amplified by the two identical amplifiers AMP1 and AMP2. The output of these two amplifiers are then subtracted and amplified in AMP3. It is in this last stage that the reduction of interference pickup from other phases is achieved.

An accurate, compact, contactless, inexpensive voltage measuring device for power line monitoring has just been described. When compared with existing measuring devices of the form shown in FIG. 2, its interference pickup is a factor of seven or more less than levels recorded when using the measuring device of FIG. 2.

Figure 11:
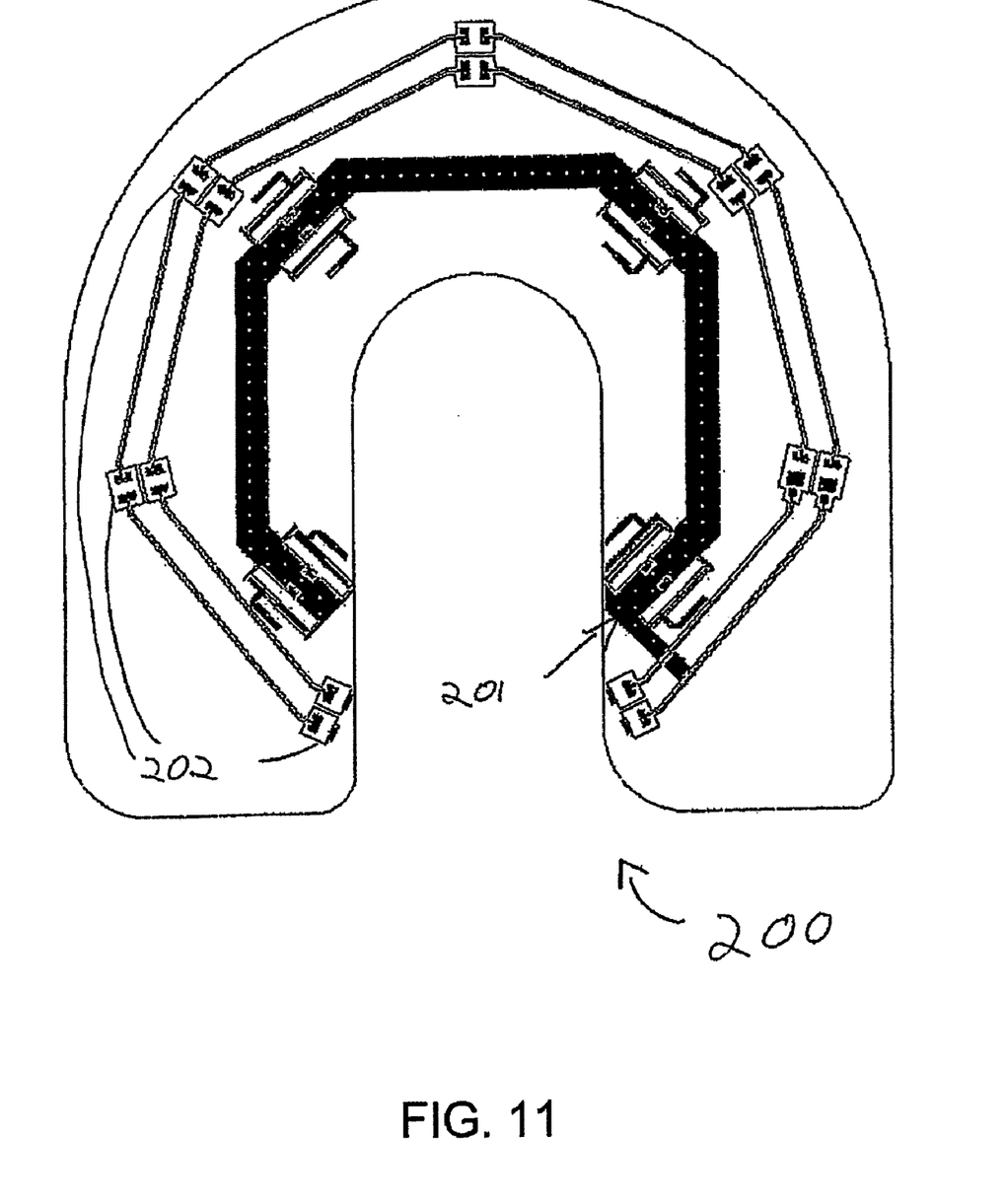
FIG. 11 is a plan view of a voltage measuring device according to the present embodiment and a current sensor according to Irish Patent Application No. S2001/0370 combined on a single motherboard.

In order to implement a complete power factor and quality measuring device, both the current and voltage of the power line must be measured. A current measuring device similar to the voltage measuring device just described is disclosed in Irish Patent Application No. S2001/0370. In that Patent Application, a number of inductive PCB sensors are vertically mounted in a symmetric fashion around the current source on a motherboard. The motherboard 200 shown in FIG. 11 shows a power factor and quality measuring device implementing both the voltage measuring device of the present embodiment and the current measuring device of the above Irish Patent Application. The voltage measuring device 201 is as described above, with the current measuring devices 202 mounted around a circle outside the voltage measuring device 201. Means for amplifying both the current and voltage measurements (not shown) may also be mounted on the same motherboard 200 producing a lightweight, inexpensive, compact, contactless measuring device for power factor and power quality measurements.

The invention is not limited to the embodiments described herein, which may be modified or varied without departing from the scope of the invention.

The invention claimed is:

1. A device for measuring alternating voltage in a conductor under test, the device comprising first and second sets of capacitive voltage sensors mounted on an electrically insulating support member, the first set of sensors being positioned along a first notional closed path and being connected in parallel between a first signal conductor and a reference conductor, the second set of sensors being positioned along a second notional closed path surrounding the first closed path and being connected in parallel between a second signal conductor and the same reference conductor as the first set, the support member being configured to allow a conductor under test to be introduced into the interior of the device so that the sensors surround the axis of the conductor under test, and each sensor having a signal electrode connected to the respective signal conductor and a reference electrode connected to the reference conductor, the sensors of the first set being orientated with the signal electrode facing the conductor under test, and the sensors of the second set being orientated with the signal electrode facing away from the conductor under test, and the device further including means for deriving the voltage in the conductor under test as a function of the voltage across the first signal conductor and the reference conductor and the voltage across the second signal conductor and the reference conductor.

2. A device as claimed in claim 1, wherein each sensor of the second set is radially aligned, relative to the axis of a conductor under test, with a respective sensor of the first set.

3. A device as claimed in claim 2, wherein each sensor of the second set is integral with a sensor of the first set whereby a plurality of composite sensors are arranged to provide both the first and second sets arranged around closely spaced first and second notional paths.

4. A device as claimed in claim 1, wherein each of said sensors is substantially identical to the others.

5. A device as claimed in claim 1, wherein the notional closed paths are circular.

6. A device as claimed in claim 1, wherein in each set the sensors are substantially equally spaced around the respective closed path.

7. A device as claimed in claim 1, wherein each reference electrode is substantially larger in area than the corresponding signal electrode so as to shield the latter from electric fields on the side of the sensor opposite the signal electrode.

8. A device as claimed in claim 1, wherein each sensor comprises a parallel plate capacitor whose plates, constituted by the signal and reference electrodes, are substantially normal to the radial direction of the conductor under test.

9. A device as claimed in claim 1, wherein each sensor comprises multiple insulating substrates laminated together with a signal electrode and at least one reference electrode separated by at least one of said insulating substrates.

10. A device as claimed in claim 9, wherein the support member comprises multiple insulating substrates laminated together with the sensors inserted in aligned apertures in the substrates, the sensors being connected in parallel as aforesaid by at least one signal conductor and at least one reference conductor deposited on non-adjacent surfaces of respective support member substrates.

11. A device as claimed in claim 10, wherein in the multilayer support structure the signal conductor(s) are formed as conductive track(s) sandwiched between a pair of reference conductors also formed as conductive tracks, the width of the reference conductive tracks being substantially greater than the width of the signal conductor track(s) so that the latter is/are shielded from external electric fields.

* * * * *